United States Patent
Lee et al.

(10) Patent No.: US 7,842,560 B2
(45) Date of Patent: Nov. 30, 2010

(54) METHOD OF MANUFACTURING THIN FILM TRANSISTOR AND METHOD OF MANUFACTURING LIQUID CRYSTAL DISPLAY DEVICE USING THE SAME

(75) Inventors: Bo Hyun Lee, Ansan-si (KR); Tae Hyoung Moon, Gwangenyeong-si (KR)

(73) Assignee: LG Display Co., Ltd., Seoul (KR)

( * ) Notice: Subject to any disclaimer, the term of this patent is extended or adjusted under 35 U.S.C. 154(b) by 145 days.

(21) Appl. No.: 12/000,078

(22) Filed: Dec. 7, 2007

(65) Prior Publication Data

US 2008/0138940 A1 Jun. 12, 2008

(30) Foreign Application Priority Data

Dec. 8, 2006 (KR) .................. 10-2006-0124387

(51) Int. Cl.
*H01L 27/108* (2006.01)
*H01L 29/94* (2006.01)

(52) U.S. Cl. ...................... 438/151; 257/296

(58) Field of Classification Search .................. 438/151
See application file for complete search history.

(56) References Cited

U.S. PATENT DOCUMENTS

| 7,427,328 | B2 * | 9/2008 | Duan et al. ................. 118/300 |
| 2003/0060038 | A1 * | 3/2003 | Sirringhaus et al. ......... 438/637 |
| 2006/0003438 | A1 * | 1/2006 | Engstrom et al. ......... 435/287.2 |
| 2007/0285843 | A1 * | 12/2007 | Tran ........................ 360/245.9 |

* cited by examiner

*Primary Examiner*—Bradley K Smith
*Assistant Examiner*—Mohammad Choudhry
(74) *Attorney, Agent, or Firm*—McKenna Long & Aldridge LLP

(57) ABSTRACT

A method of manufacturing a thin film transistor includes: forming a gate insulating layer on a substrate having a gate electrode; forming a semiconductor layer of nanomaterial on the gate insulating layer; forming a source electrode and a drain electrode on the gate insulating layer; and applying a voltage to the source electrode and the drain electrode to arrange a direction of the nanomaterial.

3 Claims, 8 Drawing Sheets

METHOD OF MANUFACTURING THIN FILM TRANSISTOR AND METHOD OF MANUFACTURING LIQUID CRYSTAL DISPLAY DEVICE USING THE SAME

This application claims the benefit of Korean Patent Application No. 2006-0124387 filed on Dec. 8, 2006, which is hereby incorporated by reference for all purposes as if fully set forth herein.

BACKGROUND OF THE INVENTION

1. Field of the Invention

The present disclosure relates to a thin film transistor, and more particularly, to a method of manufacturing a thin film transistor including a nanomaterial and a method of manufacturing a liquid crystal display device using the same.

2. Discussion of the Related Art

Recently, research for utilizing a nanomaterial such as a nanowire, a carbon nanotube, and a nanocable is actively under development. Therefore, a semiconductor layer can be formed of the nanomaterial.

The nanomaterial itself is formed of a crystal, such that its electron mobility is almost identical to that of a metal oxide semiconductor field effect transistor (MOSFET).

In the case where a thin film transistor is manufactured using the nanomaterial, the size of the thin film transistor can be minimized, so that a trend for the high degree of integration and miniaturization can be satisfied.

However, due to the lack of technology for arranging the nanomaterial until now, there is a limitation in manufacturing a nano thin film transistor.

Accordingly, it takes quite a manufacturing time to arrange the nanomaterial.

Thus, technology for easily arranging the nanomaterial is urgently needed.

Especially, the nanowire needs to be arranged with directionality to increases electron mobility. However, it is extremely difficult to form the nanowire with directionality through a present technological level.

SUMMARY OF THE INVENTION

Accordingly, the present invention is directed to a method of manufacturing thin film transistor and method of manufacturing liquid crystal display device using the same that substantially obviates one or more of the problems due to limitations and disadvantages of the related art.

An advantage of the present invention is to provide a method of manufacturing a thin film transistor capable of reducing a manufacturing time, and a method of manufacturing a liquid crystal display device using the same.

Another advantage of the present invention is to provide a method of manufacturing a thin film transistor capable of improving electron mobility.

Additional features and advantages of the invention will be set forth in the description which follows, and in part will become apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purposed of the present invention, as embodied and broadly described, a method of manufacturing a thin film transistor includes: forming a gate insulating layer on a substrate having a gate electrode; forming a semiconductor layer of nanomaterial on the gate insulating layer; forming a source electrode and a drain electrode on the gate insulating layer; and applying a voltage to the source electrode and the drain electrode to arrange a direction of the nanomaterial.

In another aspect of the present invention, a method of manufacturing a liquid crystal display device includes: forming a gate electrode and a gate line on a substrate; forming a gate insulating layer on the substrate having the gate electrode; forming a semiconductor layer of nanomaterial on the gate insulating layer; forming a source electrode and a drain electrode on the gate insulating layer; applying a voltage to the source electrode and the drain electrode to arrange a direction of the nanomaterial; forming a passivation layer on the substrate having the source electrode and the drain electrode, the passivation layer having a contact hole exposing the drain electrode; and forming a pixel electrode on the passivation layer, the pixel electrode connecting to the drain electrode.

It is to be understood that both the foregoing general description and the following detailed description are exemplary and explanatory, and are intended to provide further explanation of the invention as claimed.

BRIEF DESCRIPTION OF THE DRAWINGS

The accompanying drawings, which are included to provide further understanding of the invention and are incorporated in and constitute a part of this specification, illustrated embodiment(s) of the invention and together with the description serve to explain the principle of the invention.

In the drawings.

DETAILED DESCRIPTION OF THE ILLUSTRATED EMBODIMENTS

Reference will now be made in detail to the embodiments of the present disclosure, examples of which are illustrated in the accompanying drawings.

FIGS. 1A to 1H are views of manufacturing processes of a thin film transistor according to a first embodiment.

Figure 1A:
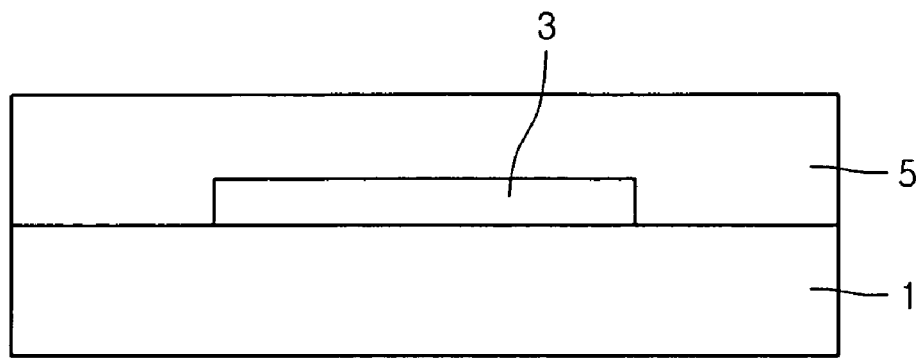
FIGS. 1A to 1H are views of manufacturing processes of a thin film transistor according to a first embodiment.

As illustrated in FIG. 1A, a first metal layer is deposited on a substrate 1, and then patterned to form a gate electrode 3.

Then, an insulating material is deposited on the substrate 1 having the gate electrode 3 to form a gate insulating layer 5.

Figure 1B:
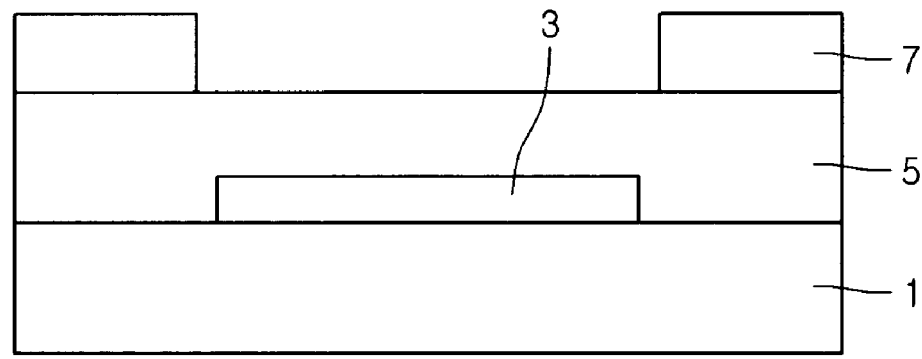

As illustrated in FIG. 1B, a photoresist material is deposited on the gate insulating layer 5 and is exposed to remove the photoresist material corresponding to a region where a thin film transistor will be formed. Therefore, a photoresist pattern 7 is formed.

Figure 1C:
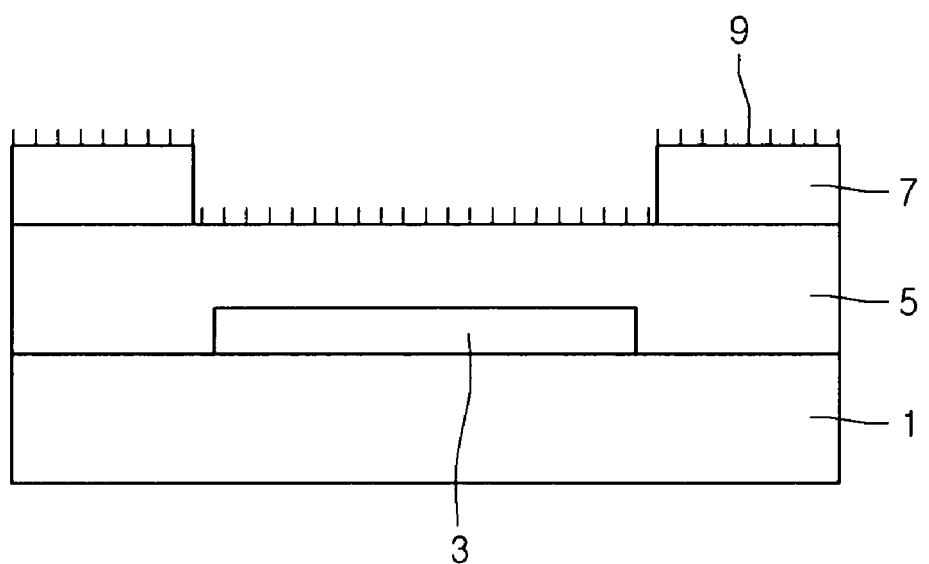

As illustrated in FIG. 1C, a self-assembled monolayer (SAM) material having a charge of a first polarity and an —NH2 group forms a SAM layer 9 on the substrate 1 having the photoresist pattern 7 through a gas reaction. The charge of the first polarity may be positive. The SAM layer 9 with a positive charge can pull a material having a negative charge and maintain a position of the pulled material.

Figure 1D:
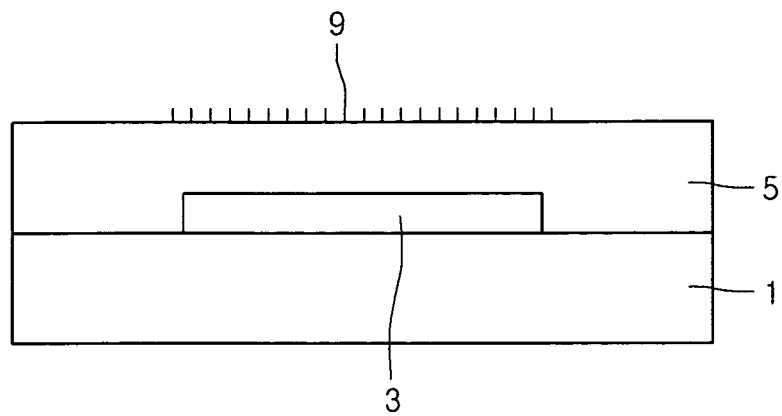

As illustrated in FIG. 1D, the photoresist pattern 7 is stripped to leave the SAM layer 9 only on the region where the thin film transistor will be formed.

Figure 1E:
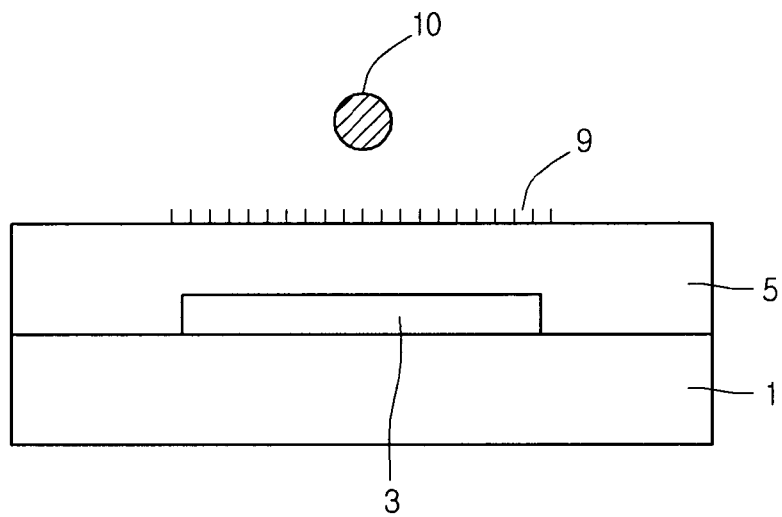

As illustrated in FIG. 1E, through a dropping apparatus such as a spuit, a nanomaterial 10 including nanowires with a second polarity is dropped into the region of the substrate I where the thin film transistor is formed. The nanomaterial 10 and the nanowires may have a negative polarity.

Figure 1F:
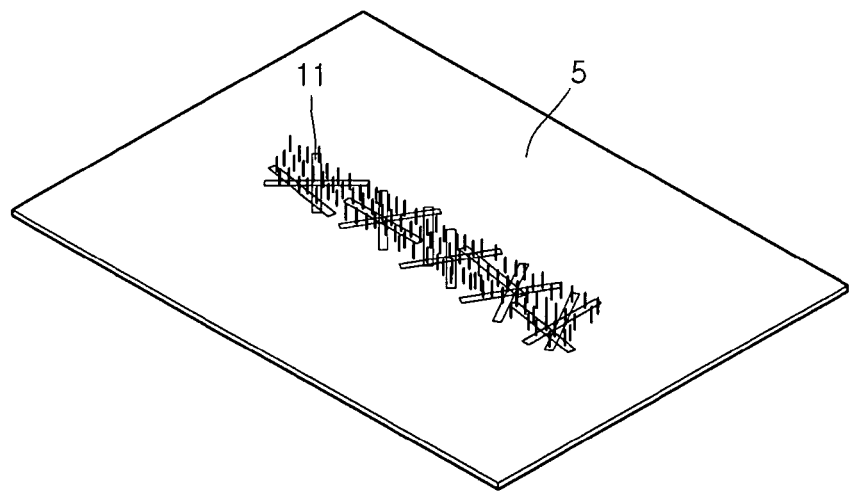

As illustrated in FIG. 1F, the nanomaterial 10 has a negative charge, and thus is pulled toward the SAM layer 9 with a positive charge, such that the nanowires 11 are formed on the SAM layer 9. Since the nanowires 11 on the SAM layer 9 are maintained by the SAM layer 9, they stay within the region where the thin film transistor is formed.

Since the nanowires 11 do not have directionality, the nanowires 11 on the SAM layer 9 are arranged in random directions. There may be a region where the nanowires 11 arranged in random directions may not contact each other. When the nanowires 11 are used as a semiconductor layer, charges may not move due to the region where the nanowires 11 do not contact each other, such that the thin film transistor does not operate. Additionally, since the nanowires 11 are arranged in random directions, charge mobility decreases.

To resolve the above limitation, the nanowires 11 are arranged with directionality through an electric field. Hereinafter, this will be described in more detail.

Figure 1G:
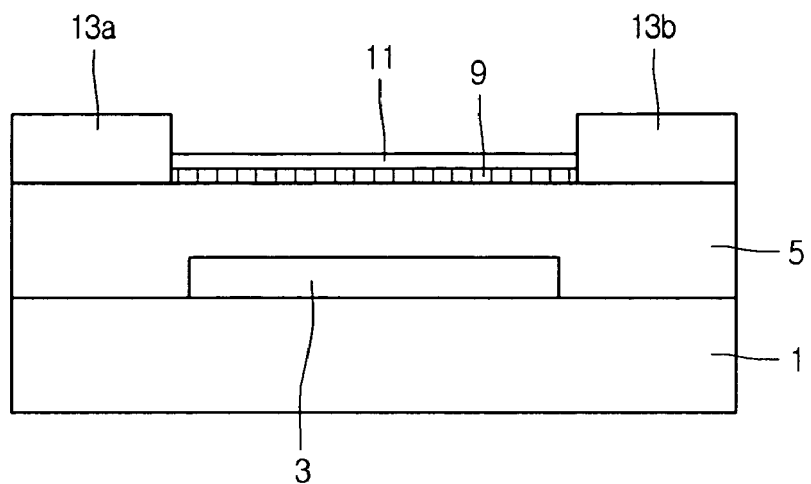

As illustrated in FIG. 1G, a second metal layer is deposited on the gate insulating layer 5 adjacent to the region where the nanowires 11 are formed, and then patterned to form a source electrode 13a and a drain electrode 13b. Although not illustrated, the source electrode 13a and the drain electrode 13b may be formed prior to forming the nanowires 11.

The first and second metal layers may include a least one of Cu, Al, AlNd, Mo, Cr, Ti, Ta, and MoW.

Figure 1H:
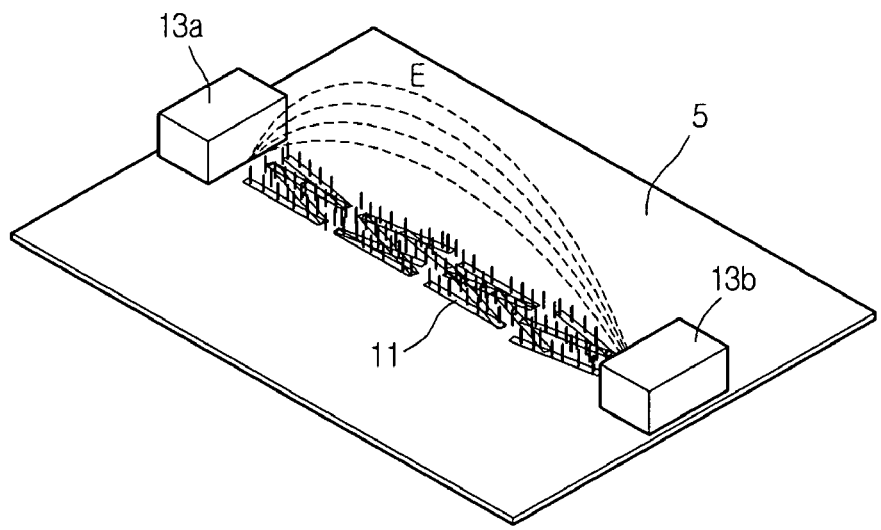

As illustrated in FIG. 1H, a predetermined voltage is applied to the source and drain electrodes 13a and 13b to form an electric field E between the source electrode 13a and the drain electrode 13b. The major axis of the nanowires 11 are arranged according to the direction of the electric field E generated between the source electrode 13a and the drain electrode 13b. The nanowires 1l1 between the source electrode 13a and the drain electrode 13b are arranged in the same direction. Accordingly, the nanowires 11 are arranged in one direction to have directionality.

Therefore, charges easily move through the nanowires 11, such that charge mobility drastically increases.

Additionally, since the nanowires 11 are arranged in the same direction, the nanowires 11 contact each other to allow charges to move, such that a thin film transistor normally operates and device characteristics can be improved.

A semiconductor layer is formed by the nanowires 11 with directionality.

The source and drain electrodes 13a and 13b are used as a supply source for a voltage used to generate the electric field E and a supply source of a signal in the thin film transistor.

That is to say, since the source and drain electrodes 13a and 13b, which are used to generate the electric field E, are not removed and remain as they are, they can become components of the thin film transistor. Accordingly, when the semiconductor layer becomes conductive due to a gate signal supplied to the gate electrode 3, a predetermined signal supplied to the source electrode 13a passes through the semiconductor layer and is applied to the drain electrode 13b.

Although not illustrated, the source and drain electrodes 13a and 13b may be removed and formed again as components of the thin film transistor.

FIGS. 2A to 2E are views of manufacturing processes of a liquid crystal display device with a thin film transistor according to a second embodiment.

The thin film transistor of FIGS. 2A to 2E may be manufactured using the same method as that of FIGS. 1A to 1H.

Figure 2A:
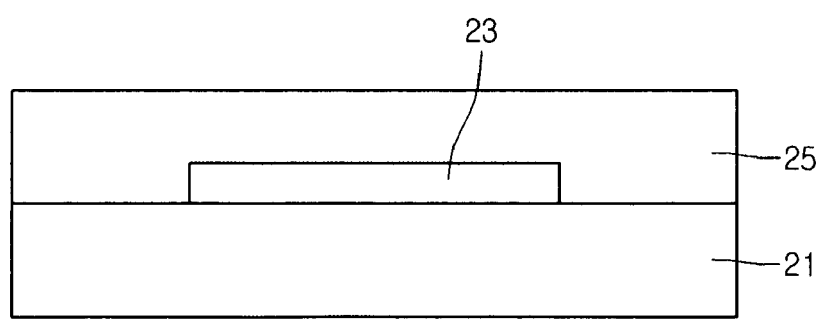
FIGS. 2A to 2E are views of manufacturing processes of a liquid crystal display device with a thin film transistor according to a second embodiment.

As illustrated in FIG. 2A, a first metal layer is deposited on a substrate 21, and then is patterned to form a gate electrode 23 and a gate line. The first metal layer may include a least one of Cu, Al, AlNd, Mo, Cr, Ti, Ta, and MoW.

A gate insulating layer 25 having an inorganic material such as SiNx and SiOx is formed on the substrate 21 having the gate electrode 23.

Figure 2B:
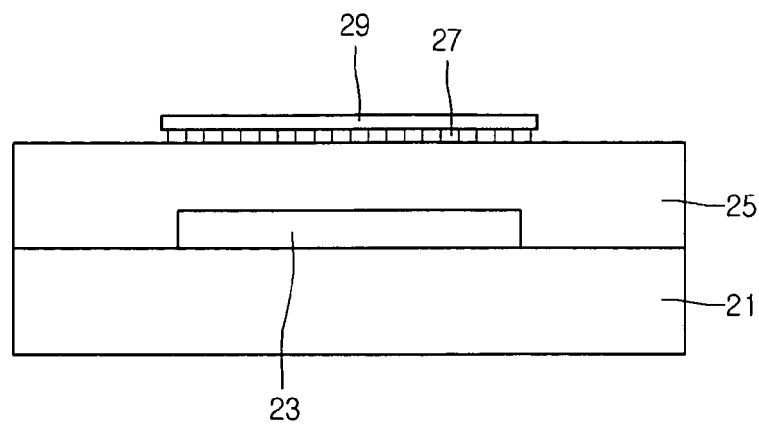

As illustrated in FIG. 2B, a semiconductor layer is formed using nanowires 29.

More specifically, a photoresist material is deposited on the gate insulating layer 25 first, and then is expose to uncover the gate insulating layer 25 corresponding to the semiconductor layer, such that a photoresist pattern (not shown) is formed.

A SAM material is formed on the substrate 21 having the photoresist pattern through a vapor phase reaction. The SAM material has a first polarity charge (e.g., a negative charge) and an —NH2 group.

After stripping the photoresist pattern, nanowires 29 are formed on the SAM layer 27 corresponding to the semiconductor layer by dropping nanomaterial including the nanowires 29. The nanomaterial has a second polarity charge (e.g., a positive charge) opposite to the first polarity charge.

Figure 2C:
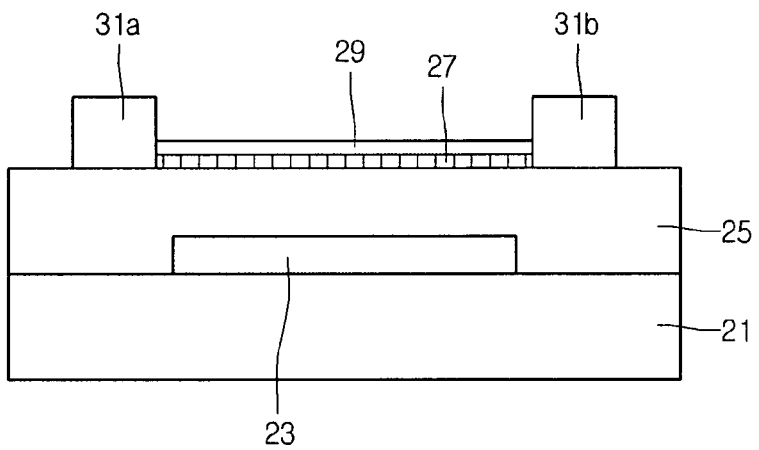

As illustrated in FIG. 2C, a second metal material is deposited on the gate insulating layer 25 adjacent to the region where the nanowires 29 are formed, and then patterned to form a source electrode 31a and a drain electrode 31b, and a data line. The second metal material may include a least one of Cu, Al, AlNd, Mo, Cr, Ti, Ta, and MoW. Although not illustrated, the source electrode 31a, the drain electrode 31b and the data line may be formed prior to forming the nanowires 29.

Then, a predetermined voltage is applied to the source and drain electrodes 31a and 31b to form an electric field between the source electrode 31a and the drain electrode 31b. Accordingly, the nanowires 29 on the SAM layer 27 are arranged in one direction according to the direction of the electric field. Therefore, since the nanowire 29 have directionality, charge mobility drastically can be improved, and furthermore, because a non-contact region where the nanowires 20 do not contact each other is not formed, charge mobility is smoothly performed. Therefore, operational characteristics of a device can be improved.

A semiconductor layer is formed using the nanowires 29, which are arranged through the electric field.

Figure 2D:
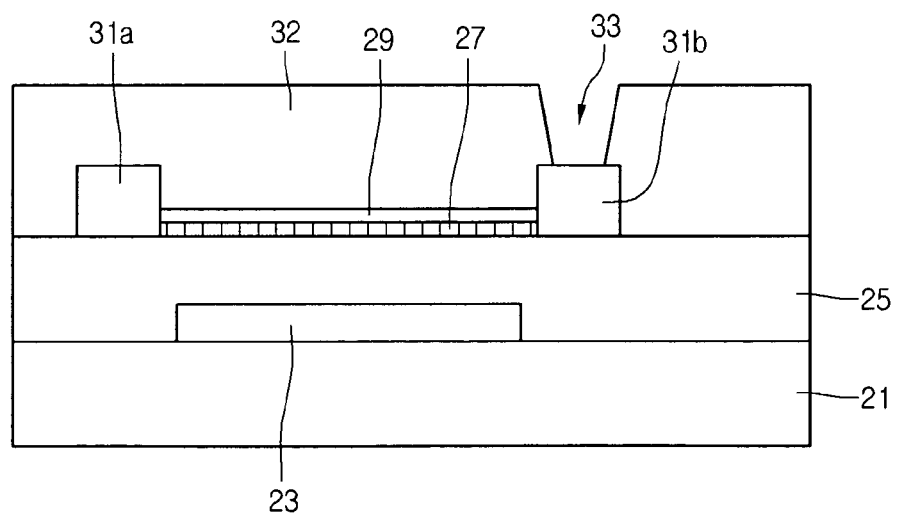

As illustrated in FIG. 2D, a passivation layer including an inorganic layer such as SiNX, SiOx, etc. or an organic layer such as BCB, acrylic, etc. is formed on the substrate 21 having the source and drain electrodes 31a and 31b.

Next, the passivation layer 32 is etched to expose the drain electrode 31b, such that a contact hole 33 is formed.

Figure 2E:
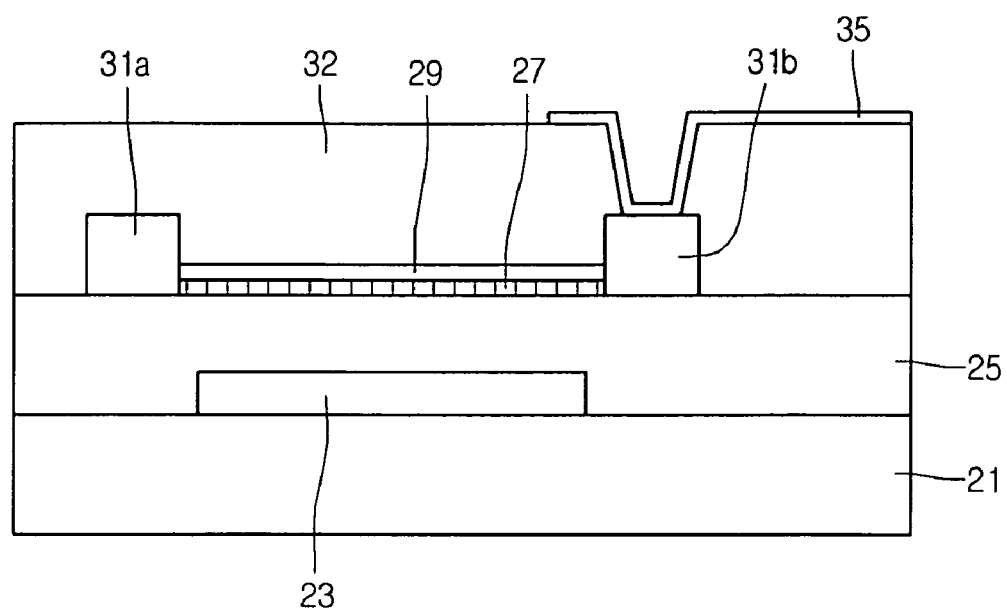

As illustrated in FIG. 2E, a transparent conductive material such as indium tin oxide (ITO) and indium zinc oxide (IZ) is deposited, and then patterned to form a pixel electrode 35. The pixel electrode 35 may be connected to the drain electrode 31b through the contact hole 33. The pixel electrode may be connected to the drain electrode 31b via an intermediate layer.

Through the above processes, a liquid crystal display device with a thin film transistor, which includes a semiconductor layer formed by the nanowires 29, can be manufactured.

Accordingly, the liquid crystal display device arranges the nanowires 29, which are randomly arranged, in one direction by using an electric field. Therefore, charge mobility can be improved, and an operating speed of the thin film transistor can be increased. Furthermore, the thin film transistor normally operates without disconnection of the nanowires 29, such that operational characteristics of the thin film transistor can be improved.

FIGS. 3A to 3H are views of manufacturing processes of a thin film transistor according to a third embodiment.

The second embodiment is similar to the first embodiment. Accordingly, processes similar to those of the first embodiment will be briefly described in the description of the second embodiment.

Figure 3A:
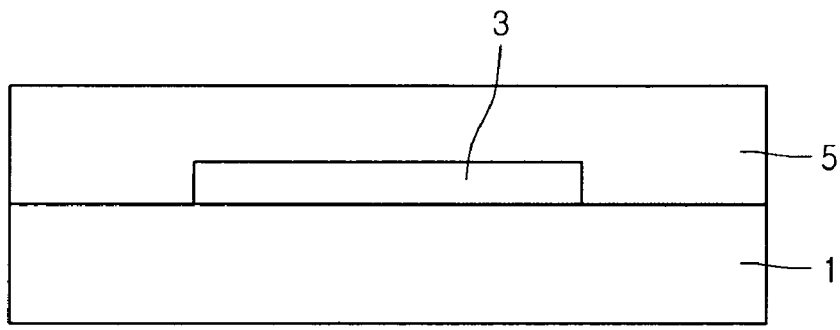
FIGS. 3A to 3H are views of manufacturing processes of a thin film transistor according to a third embodiment.

As illustrated in FIG. 3A, a first metal layer is deposited on the substrate 1, and then patterned to form a gate electrode 3.

Next, an insulating material is deposited on the substrate 1 having the gate electrode 3 to form a gate insulating layer 5.

Figure 3B:
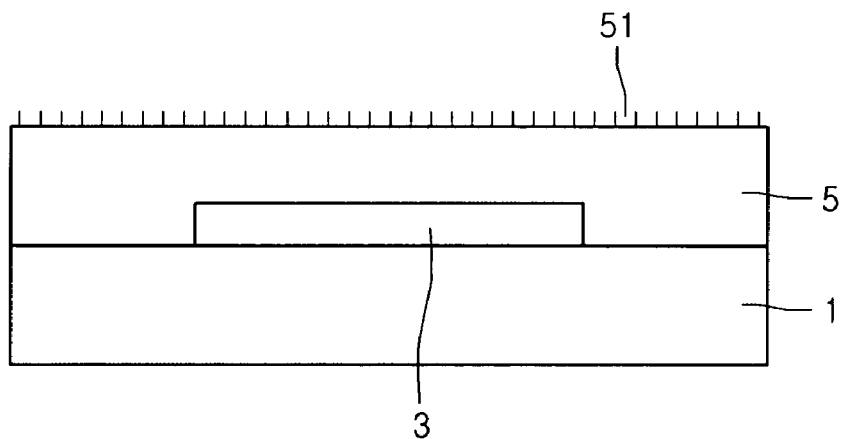

As illustrated in FIG. 3B, a SAM material having a charge of a first polarity and an —NH2 group forms a SAM layer 51 on the gate insulating layer 5 through a gas reaction. The charge of the first polarity may be positive.

Figure 3C:
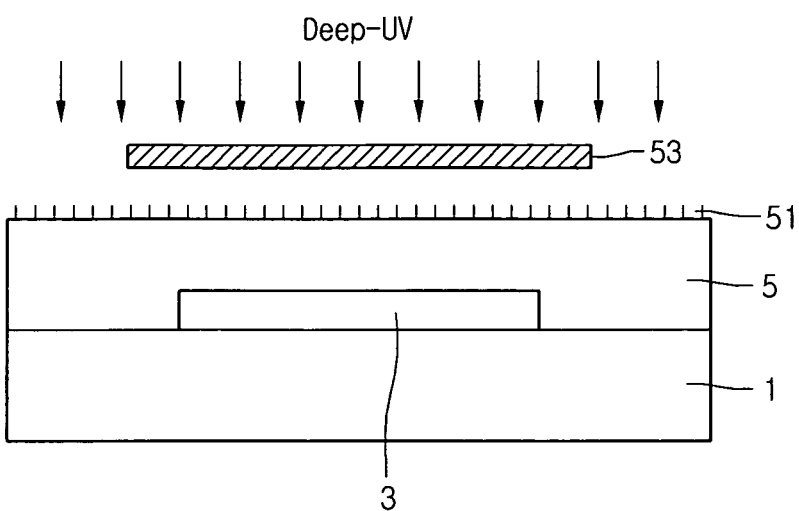

As illustrated in FIG. 3C, after a mask 53 is arranged, a deep-ultraviolet (UV) irradiation is projected on the SAM layer 51.

Figure 3D:
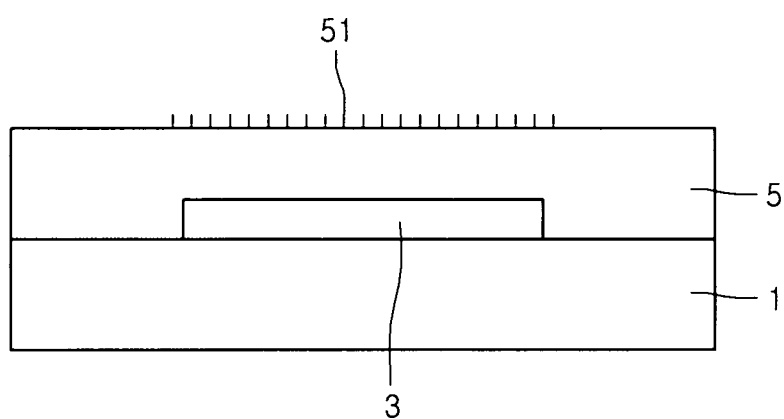

As illustrated in FIG. 3D, the SAM layer 51 where the deep-UV is blocked by the mask 53 does not change, but the SAM layer 51 on which the deep-UV transmitted through the mask 53 is projected is photo-decomposed by the deep-UV. Accordingly, the SAM layer 51 is removed from all other regions except for the region where the semiconductor layer is formed.

Figure 3E:
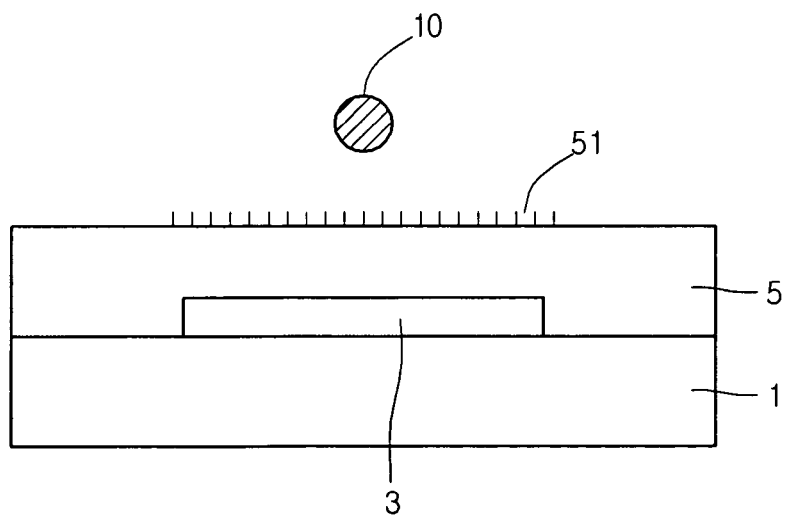

As illustrated in FIG. 3E, a nanomaterial 10 including nanowires with a second polarity is dropped into the region where the thin film transistor is formed. The nanomaterial 10 with the nanowires may have a negative second polarity.

Figure 3F:
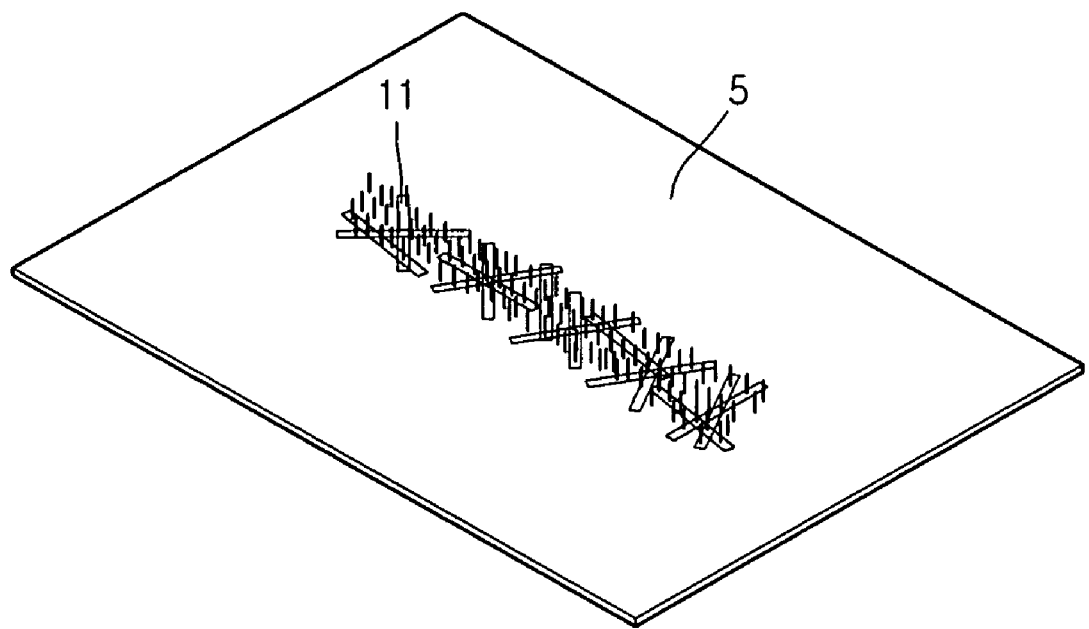

As illustrated in FIG. 3F, the nanomaterial 10 may have a negative charge, and thus is pulled toward an SAM layer 51 with a positive charge, such that the nanowires 11 are formed on the SAM layer 51. Since the nanowires 11 on the SAM layer 51 are maintained by the SAM layer 9, they stays within the region where the thin film transistor is formed.

The nanowires 11 on the SAM layer 51 are arranged in random directions.

Figure 3G:
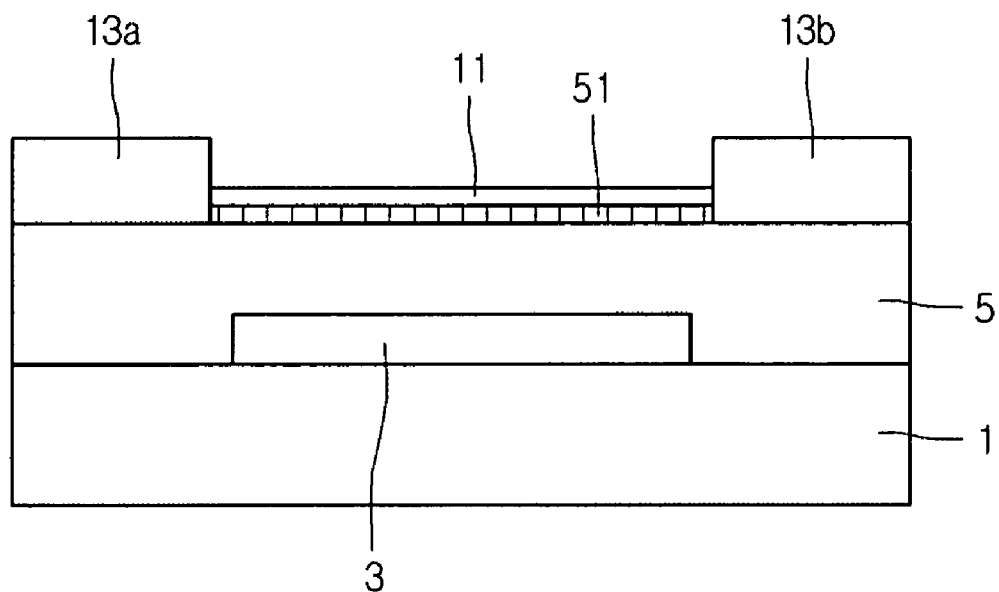

As illustrated in FIG. 3G, a second metal layer is deposited on the gate insulating layer 5 adjacent to the region where the nanowires 11 are formed, and then patterned to form a source electrode 13a and a drain electrode 13b. Although not illustrated, the source electrode 13a and the drain electrode 13b may be formed prior to forming the nanowires 11.

Figure 3H:
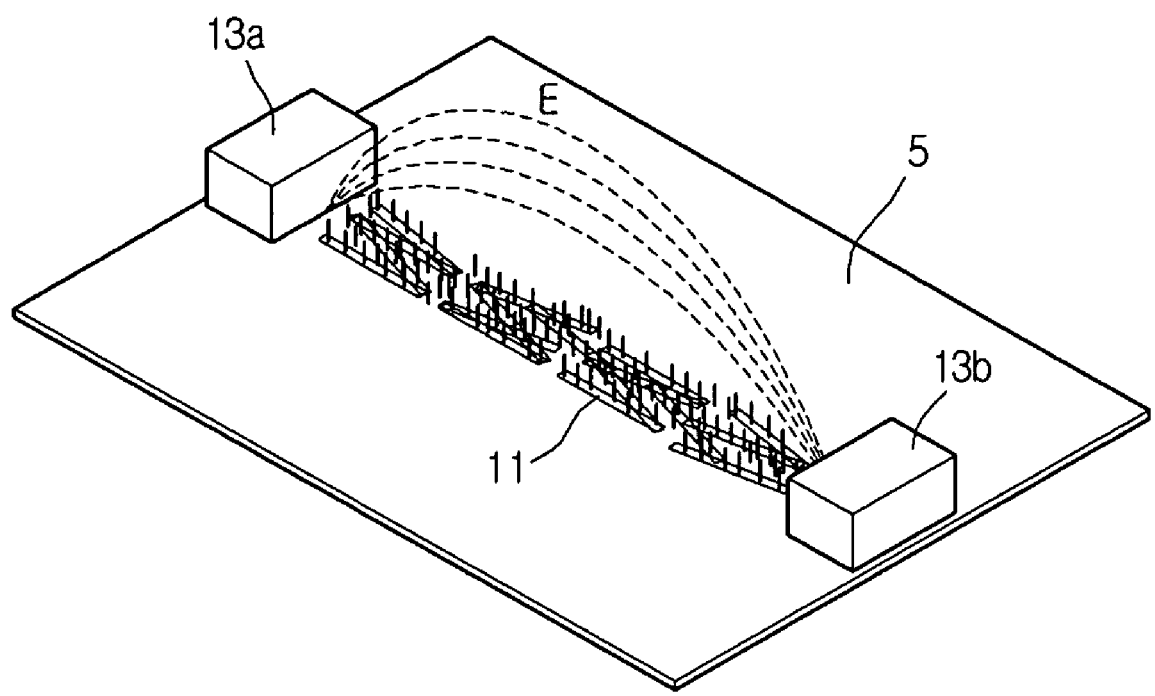

As illustrated in FIG. 3H, a predetermined voltage is applied to the source and drain electrodes 13a and 13b to form an electric field E between the source electrode 13a and the drain electrode 13b. The major axis of the nanowires 11 are arranged according to the direction of the electric field E generated between the source electrode 13a and the drain electrode 13b. The nanowires 11 between the source electrode 13a and the drain electrode 13b are arranged in the same direction. Accordingly, the nanowires 11 are arranged in one direction to have directionality.

Therefore, charges easily move through the nanowires 11, such that charge mobility drastically increases.

Additionally, since the nanowires 11 are arranged in the same direction, the nanowires 11 contact each other to allow charges to move, such that a thin film transistor normally operates and device characteristics can be improved.

A semiconductor layer is formed by the nanowires 11 with the directionality.

The source and drain electrodes 13a and 13b are used as a supply source for a voltage used to generate the electric field E and a supply source of a signal in the thin film transistor.

That is to say, since the source and drain electrodes 13a and 13b, which are used to generate the electric field E, are not removed and remain as they are, they can become components of the thin film transistor. Accordingly, when the semiconductor layer becomes conductive due to a gate signal supplied to the gate electrode 3, a predetermined signal supplied to the source electrode 13a passes through the semiconductor layer and is applied to the drain electrode 13b.

Although not illustrated, the source and drain electrodes 13a and 13b may be removed and formed again as components of the thin film transistor.

The thin film transistor manufactured by the above manufacturing processes can be easily applied to a liquid crystal display device. The liquid crystal display device with the thin film transistor improves the mobility and operating speed of the thin film transistor, such that high-speed drive is possible. Additionally, the nanowires 11 are arranged in one direction in the liquid crystal display device, such that malfunctions of the thin film transistor can be prevented.

As described above, according to the embodiments, since the nanowires are arranged in one direction through the electric field, charge mobility can be improved. Additionally, an operating speed of the thin film transistors can also drastically increase.

Additionally, since the thin film transistor is manufactured using the nanowires, the size of the thin film transistors is reduced to satisfy the trend for the high degree of integrations and miniaturization.

According to the embodiments, since operational performance of the thin film transistor is enhanced, reliability for products can be improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing a thin film transistor, the method comprising:

forming a gate insulating layer on a substrate having a gate electrode;

forming a semiconductor layer of nanomaterial on the gate insulating layer;

forming a source electrode and a drain electrode on the gate insulating layer; and applying a voltage to the source electrode and the drain electrode to arrange a direction of the nanomaterial, wherein the nanomaterial includes a nanowire, wherein a major axis of the nanowire is arranged according to a direction of an electric field between the source electrode and the drain electrode, wherein the step of forming the semiconductor layer of nanomaterial on the gate insulating layer includes:

forming a self-assembled monolayer having a first polarity charge on the gate insulating layer; and dropping the nanomaterial on the substrate having the self-assembled monolayer, the nanomaterial having a second polarity charge, wherein the first polarity charge is positive and the second polarity charge is negative, wherein the self-assembled monolayer includes an —NH2 group, wherein the step of forming the self-assembled monolayer having the first polarity charge on the gate insulating layer includes:

projecting a deep-ultraviolet on a mask to leave the self-assembled monolayer on a region where the semiconductor layer is formed.

2. The method of claim 1, wherein the self-assembled monolayer is formed by vapor phase reaction.

3. A method of manufacturing a liquid crystal display device, the method comprising:

forming a gate electrode and a gate line on a substrate;

forming a gate insulating layer on the substrate having the gate electrode;

forming a semiconductor layer of nanomaterial on the gate insulating layer;

forming a source electrode and a drain electrode on the gate insulating layer;

applying a voltage to the source electrode and the drain electrode to arrange a direction of the nanomaterial;

forming a passivation layer on the substrate having the source electrode and the drain electrode, the passivation layer having a contact hole exposing the drain electrode; and forming a pixel electrode on the passivation layer, the pixel electrode connecting to the drain electrode, wherein the nanomaterial includes a nanowire, wherein a major axis of the nanowire is arranged according to a direction of an electric field between the source electrode and the drain electrode, wherein the step of forming the semiconductor layer of nanomaterial on the gate insulating layer includes:

forming a self-assembled monolayer having a first polarity charge on the gate insulating layer; and dropping the nanomaterial on the substrate having the self-assembled monolayer, the nanomaterial having a second polarity charge, wherein the first polarity charge is positive and the second polarity charge is negative, wherein the self-assembled monolayer includes an —NH2 group, wherein the step of forming the self-assembled monolayer having the first polarity charge on the gate insulating layer includes:

projecting a deep-ultraviolet on a mask to leave the self-assembled monolayer on a region where the semiconductor layer is formed.

* * * * *